US012610489B2

(12) United States Patent
Guo et al.

(10) Patent No.: US 12,610,489 B2
(45) Date of Patent: Apr. 21, 2026

(54) LATCH SYSTEM FOR LATCHING A CARD TO A BOARD

(71) Applicant: TOSHIBA GLOBAL COMMERCE SOLUTIONS, INC., Durham, NC (US)

(72) Inventors: Jui-Chieh Guo, Taipei (TW); Ming-Lei Lin, Taipei (TW); Chen-ming Hsu, Taipei (TW); Yu Fen Hung, Taoyuan (TW)

(73) Assignee: TOSHIBA GLOBAL COMMERCE SOLUTIONS, INC., Durham, NC (US)

( * ) Notice: Subject to any disclaimer, the term of this patent is extended or adjusted under 35 U.S.C. 154(b) by 149 days.

(21) Appl. No.: 18/403,642

(22) Filed: Jan. 3, 2024

(65) Prior Publication Data

US 2025/0220841 A1 Jul. 3, 2025

(51) Int. Cl.
H05K 7/14 (2006.01)
G06F 1/183 (2026.01)

(52) U.S. Cl.
CPC ........... H05K 7/1402 (2013.01); G06F 1/183 (2013.01)

(58) Field of Classification Search
CPC ...................... H05K 7/1402; G06F 1/183–185

USPC .................................................. 361/801, 803
See application file for complete search history.

(56) References Cited

U.S. PATENT DOCUMENTS

| | | | | |
|---|---|---|---|---|
| 5,214,569 A | * | 5/1993 | Hsiang ................... | H05K 7/142 361/748 |
| 5,501,436 A | * | 3/1996 | Miller .................... | B23Q 3/186 269/305 |
| 2005/0047860 A1 | * | 3/2005 | Deas ....................... | H05K 7/142 403/397 |

* cited by examiner

*Primary Examiner* — Hung S. Bui
(74) *Attorney, Agent, or Firm* — Patterson + Sheridan, LLP; Gero G. McClellan

(57) ABSTRACT

An apparatus includes a board defining a slot. The slot has a channel that interconnects at least two enlarged openings, including a locking opening. The apparatus also includes a card and a locking slide. The locking slide has a neck and retainer segments on opposing sides of the neck that retain the locking slide in the slot. The locking slide is slidable along the channel from one enlarged opening to another. The locking slide has a lock segment that latches the card to the board when the locking slide is positioned in the locking opening. A method of latching the card to the board using the locking slide is also provided.

19 Claims, 11 Drawing Sheets

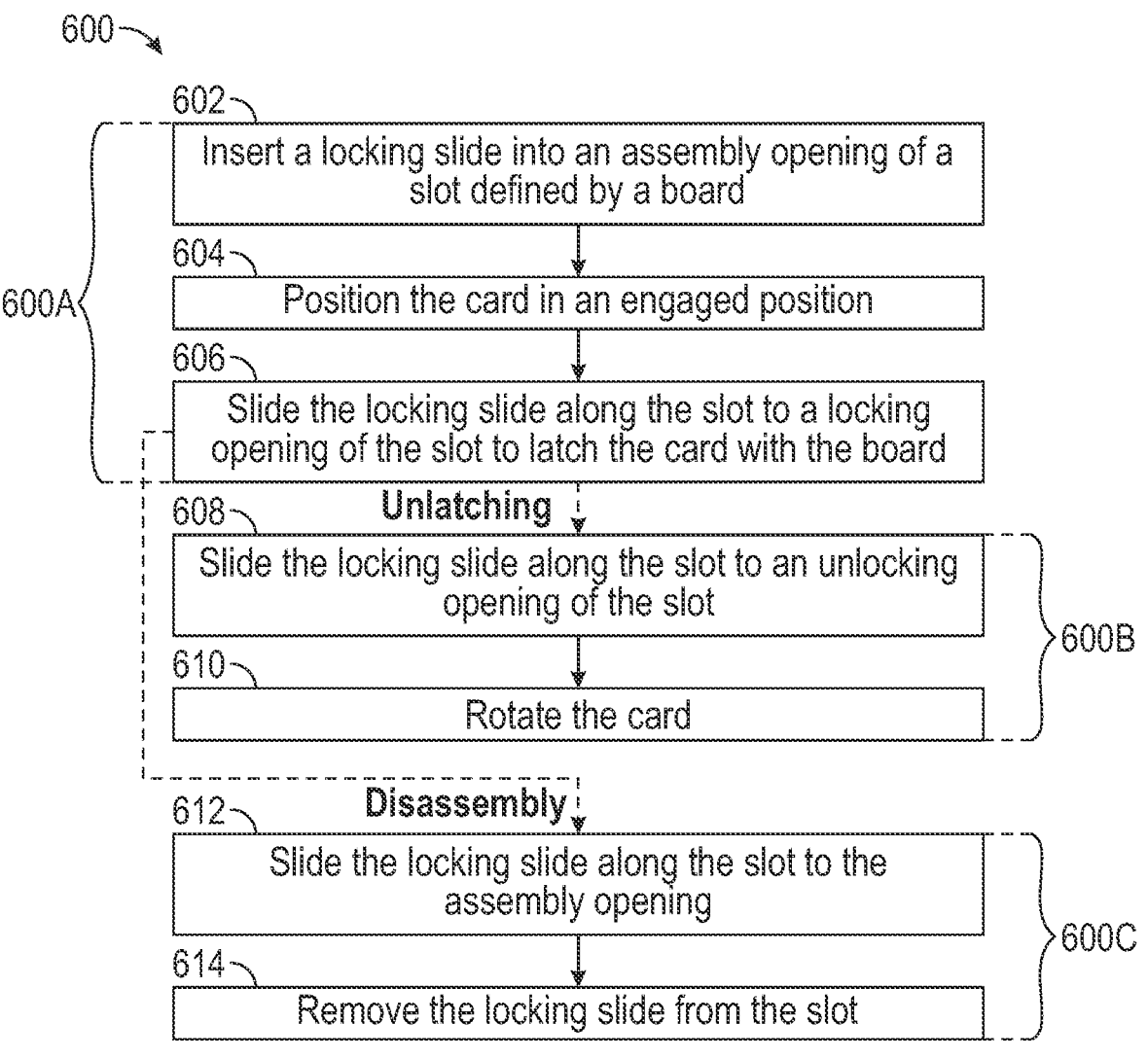

600

602
Insert a locking slide into an assembly opening of a slot defined by a board 604
Position the card in an engaged position 606
Slide the locking slide along the slot to a locking opening of the slot to latch the card with the board

600A

Unlatching

608
Slide the locking slide along the slot to an unlocking opening of the slot

610
Rotate the card

600B

Disassembly

612
Slide the locking slide along the slot to the assembly opening

614
Remove the locking slide from the slot

LATCH SYSTEM FOR LATCHING A CARD TO A BOARD

BACKGROUND

The present disclosure relates to a latch system for latching a card to a board.

BRIEF DESCRIPTION OF THE DRAWINGS

FIG. 12 is a flow diagram for a method.

DETAILED DESCRIPTION

System boards, such as Printed Circuit Boards (PCBs), can have one or more cards, such as Solid-State Drive (SSD) cards, mounted thereto. Various conventional mounting elements, such as holders, PCB mounting pillars, retention clips, etc., have been used to secure such cards to boards. Such conventional mounting elements have certain drawbacks, such as being easily damaged after a few card re-installations, requiring adhesives for attachment to the card and/or board, requiring tools for installation, and/or have designs that require components that are permanently fixed to the board and thus cannot be removed when no card is installed.

In accordance with aspects of the present disclosure, a latching system that addresses one or more of the above-noted challenges is provided herein. In at least one example, the present disclosure provides a latching system that includes a tool-less device that can latch/unlatch a card to/from a board. The device, or so called "locking slide", can be removed from the system board when no card is installed. Adhesives do not have to be used to secure the card to the board. Moreover, the device is structurally sound and is not easily damaged, even after repeated card re-installations. The features of the latching system disclosed herein can be incorporated into many applications, such as for latching a SSD card to a system board of a checkout terminal or Point of Sale (POS) device.

In some embodiments, an apparatus equipped with a latching system is provided. The apparatus includes a board, a card, and a locking slide that each include features that form the latching system. The locking slide can be slid along a slot defined by the board. The slot can include enlarged openings and a narrower channel that interconnects the enlarged openings. The locking slide can include a neck and retainer segments on opposing sides of the neck. The retainer segments retain the neck in the slot as the locking slide is slid. When the locking slide is positioned within a locking opening, which is one of the enlarged openings, a lock segment of the locking slide can latch the card to the board. The locking slide can be retained within the locking opening by the rotated-orientation of the locking slide and/or by unique elastically deformable features of the neck. The locking slide can also be slid to the other enlarged openings of the slot, e.g., to unlatch the card for repair/replacement and/or for disassembly of the locking slide.

Figure 1:
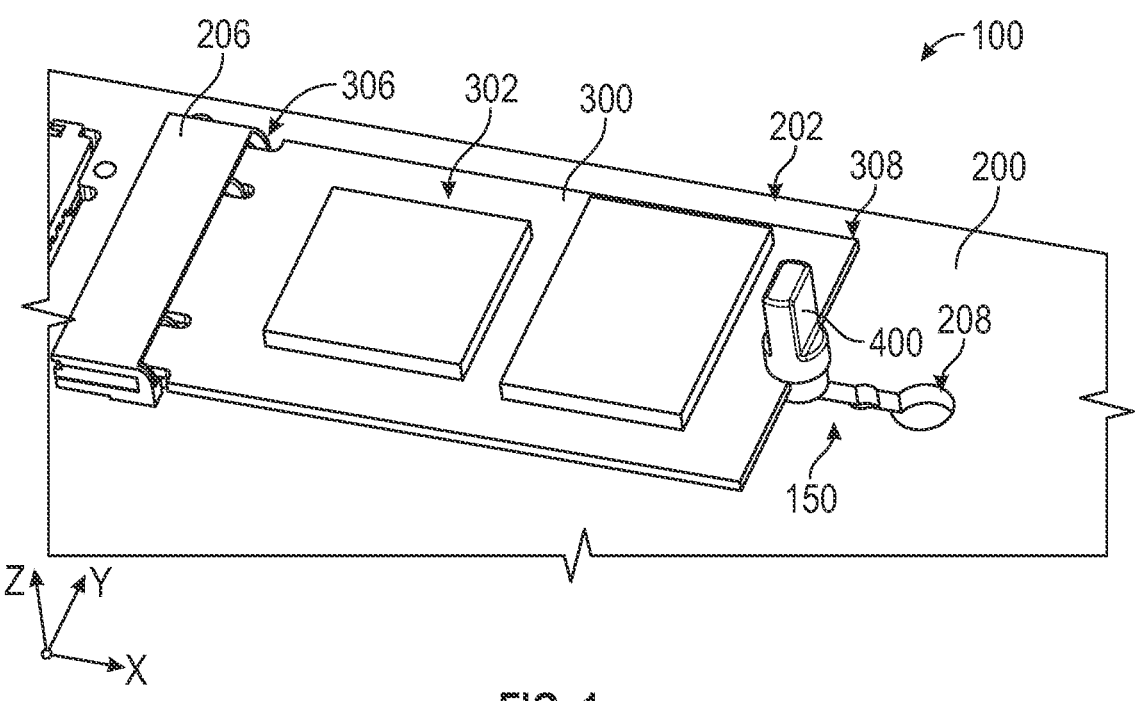
FIG. 1 is a perspective view of a portion of an apparatus according to one example embodiment of the present disclosure.

FIG. 1 is a perspective view of a portion of an apparatus 100 according to one example embodiment of the present disclosure. For reference, the apparatus 100 defines a first direction X, a second direction Y, and a third direction Z. The first, second, and third directions X, Y, Z are mutually perpendicular and form an orthogonal direction system. The first direction X can be a longitudinal direction, the second direction Y can be a lateral direction, and the third direction Z can be a vertical direction, for example.

As depicted in FIG. 1, the apparatus 100 includes a board 200, a card 300, and a locking slide 400. The board 200, the card 300, and the locking slide 400 include features that form a latch system 150 for latching/unlatching the card 300 to/from the board 200. The board 200 can be a Printed Circuit Board (PCB) and the card 300 can be a Solid-State Drive (SSD), or SSD card, for example. The apparatus 100 can be incorporated into a checkout terminal or POS device, for example. The card 300 has a first surface 302 (e.g., a top surface) and an opposing second surface 304 (e.g., a bottom surface; see FIG. 6). In addition, the card 300 has a first end 306 and a second end 308. The first end 306 is coupled with the board 200. In at least one example, the first end 306 of the card 300 is coupled with the board 200 via a connector 206. The first end 306 of the card 300 can be inserted into the connector 206 and can contact an internal edge of the connector 206. The card 300 can then be rotated down, e.g., to an engaged position. Generally, to secure the card 300 to the board 200, the locking slide 400 can be slid into position to latch the card 300 to the board 200, e.g., as shown in FIG. 1. To replace or remove the card 300 from the board 200, the locking slide 400 can be slid away from the card 300 to unlatch the second end 308 of the card 300 from the board 200. The card 300 can then be removed from the board 200.

Figure 2:
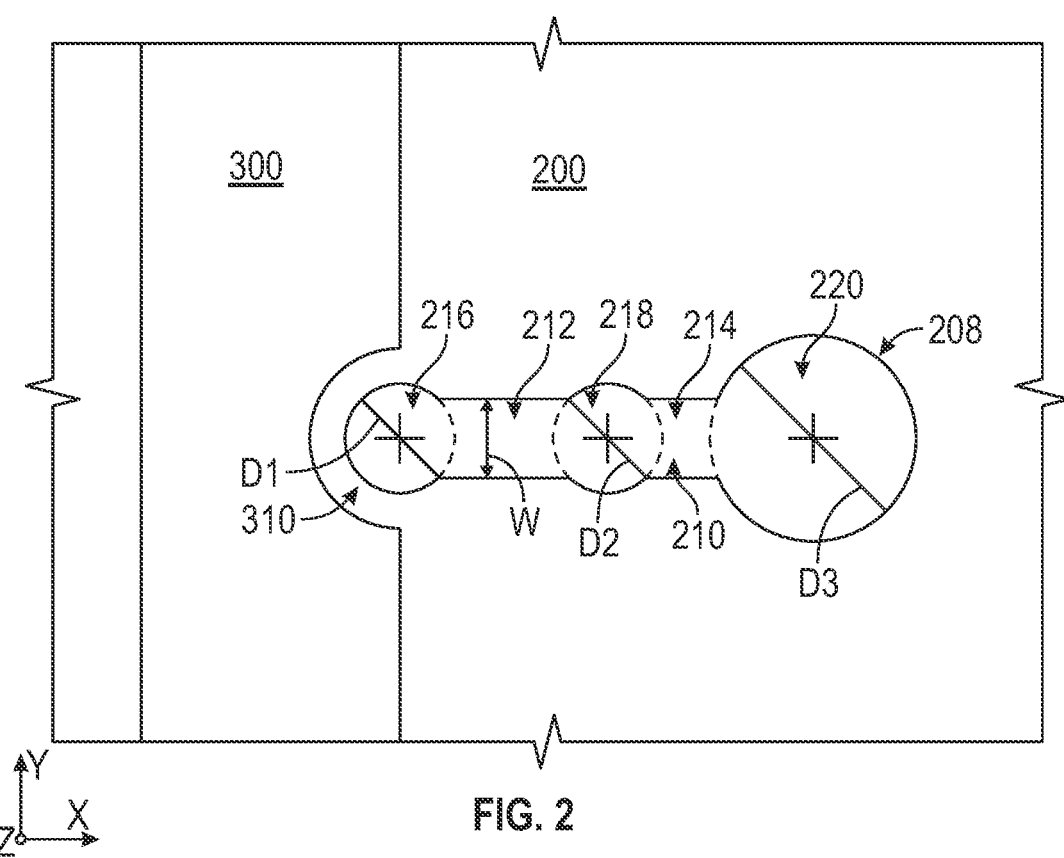
FIG. 2 is a top plan view of a portion of the apparatus of FIG. 1.

With reference now to FIGS. 1 and 2, FIG. 2 is a top plan view of a portion of the apparatus 100 of FIG. 1, with the locking slide 400 removed for illustrative purposes. As shown, the board 200 has a first surface 202 (e.g., a top surface) and an opposing second surface 204 (e.g., a bottom surface; see FIG. 6). The board 200 defines a slot 208. The slot 208 has a depth extending between the first surface 202 and the second surface 204. The slot 208 has a channel 210 that interconnects at least two enlarged openings. The at least two enlarged openings include at least a locking opening 216. For this example embodiment, the slot 208 includes the locking opening 216, an unlocking opening 218, and an assembly opening 220. The locking opening 216, the unlocking opening 218, and the assembly opening 220 are spaced from one another (e.g., along the first direction X) and are serially interconnected by the channel 210. As shown, the channel 210 includes a first leg 212 that interconnects the locking opening 216 and the unlocking opening 218 and a second leg 214 that interconnects the unlocking opening 218 and the assembly opening 220. In some alternative embodiments, the slot 208 can include the locking opening 216 and either the unlocking opening 218 or the assembly opening 220.

The locking opening 216 has a first diameter D1, the unlocking opening 218 has a second diameter D2, and the assembly opening 220 has a third diameter D3. For the depicted embodiment of FIGS. 1 and 2, the assembly opening 220 has a greater diameter than both the locking opening 216 and the unlocking opening 218. That is, the third diameter D3 is greater than the first diameter D1 and greater than the second diameter D2. Moreover, for this embodiment, the locking opening 216 and the unlocking opening 218 have a same diameter. In this way, the first diameter D1 is equal to the second diameter D2. The channel 210 has a width W. The width W can be fixed, or stated differently, the channel 210 can have a fixed width. The width W of the channel 210 can be narrower or less than the first diameter D1, the second diameter D2, and the third diameter D3.

The card 300 defines a latch cutout 310. The latch cutout 310 has a semicircular shape. However, other shapes are contemplated. When the card 300 is in its engaged position (e.g., as shown in FIGS. 1 and 2), the latch cutout 310 is in communication with the locking opening 216 of the slot 208. Stated differently, at least a portion of the locking opening 216 is aligned with the latch cutout 310 along the first and second directions X, Y. For this embodiment, the latch cutout 310 is in communication with the locking opening 216 of the slot 208 so that no portion of the card 300 confronts the locking opening 216 when the card 300 is in the engaged position, e.g., as shown in FIG. 2. The latch cutout 310 allows for the locking slide 400 to be fully received within the locking opening 216. In FIG. 1, the locking slide 400 is shown received within the locking opening 216 and received by the latch cutout 310.

The locking slide 400, or slidable retainer, is slidable within the slot 208. When the locking slide 400 is positioned in the locking opening 216, the locking slide 400 can engage and secure the second end 308 of the card 300 to the board 200. In this regard, the locking slide 400 can latch the card 300 to the board 200. The locking slide 400 can be slid along the channel 210 to the unlocking opening 218. When the locking slide 400 is positioned in the unlocking opening 218, the locking slide 400 is moved out of the way so that the second end 308 of the card 300 becomes a "free end" unlatched from the board 200. Accordingly, the card 300 can be removed from the connector 206 and removed from the board 200. The locking slide 400 can also be slid along the channel 210 to the assembly opening 220. When the locking slide 400 is positioned in the assembly opening 220, the locking slide 400 can be removed from the slot 208 for disassembly purposes. The assembly opening 220 is thus sized to accommodate removal of the locking slide 400 from the slot 208. For assembly purposes, the assembly opening 220 is sized to accommodate insertion of the locking slide 400 into the slot 208. Accordingly, the assembly opening 220 can function as an ingress/egress for the locking slide 400 with respect to the board 200.

Figure 3:
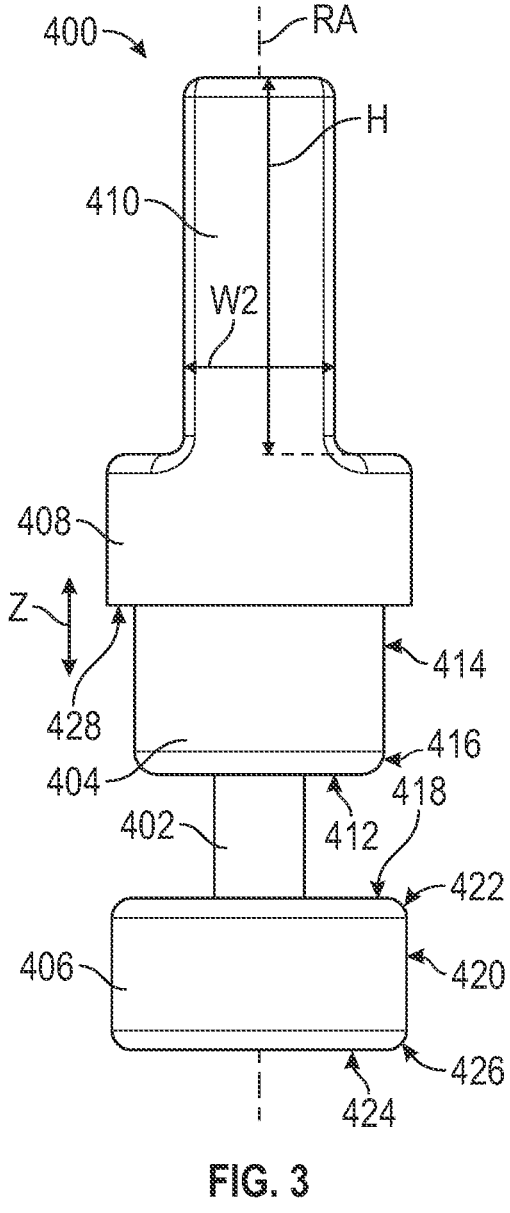
FIGS. 3 and 4 are elevation views of a locking slide according to example embodiments of the present disclosure, with FIG. 3 depicting the locking slide in a slide orientation and FIG. 4 depicting the locking slide in a non-slide orientation.
Figure 4:
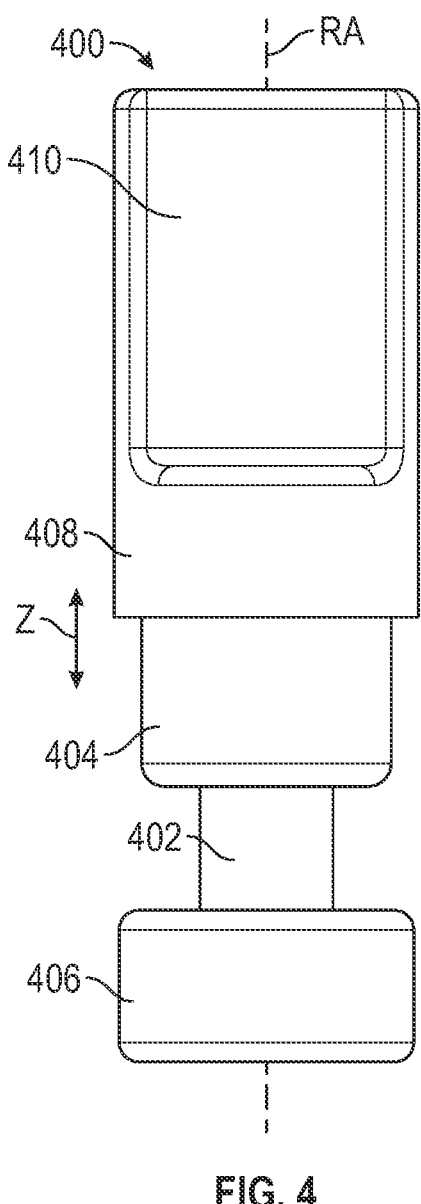

FIGS. 3 and 4 are elevation views of the locking slide 400 according to example embodiments of the present disclosure, with FIG. 3 depicting the locking slide 400 in a slide orientation and FIG. 4 depicting the locking slide 400 in a non-slide orientation. The views in FIGS. 3 and 4 are taken from the same vantage point, but in FIG. 4 the locking slide 400 is rotated by ninety degrees (90°) compared to the orientation of the locking slide 400 in FIG. 3. In this regard, the locking slide 400 of FIGS. 3 and 4 is a "rotatable locking slide" that can be rotated at certain locations along the slot 208 (FIGS. 1 and 2), e.g., the locking slide 400 can be rotated within any one of the enlarged openings.

As shown in FIGS. 3 and 4, the locking slide 400 has a neck 402 and retainer segments 404, 406 on opposing sides of the neck 402. Generally, the retainer segments 404, 406 retain the locking slide 400 in the slot 208 (FIGS. 1 and 2), and depending on the orientation of the locking slide 400, the neck 402 can allow the locking slide 400 to be slid along the slot 208 or prevented from being slid along the slot 208. In at least one example, the locking slide 400 is rotatable between a slide orientation (FIG. 3) and a non-slide orientation (FIG. 4). To switch between the orientations, the locking slide 400 can be rotated by ninety degrees (90°) about a rotation axis RA, for example. When in the slide orientation, the locking slide 400 is movable or slidable along the channel 210 from one enlarged opening to another. In contrast, in the non-slide orientation, the locking slide 400 is prevented from being moved along the channel 210. Accordingly, in the non-slide orientation, the locking slide 400 is constrained within the enlarged opening in which the locking slide 400 is positioned. When the locking slide 400 is slid along the channel 210 from one enlarged opening to another, the neck 402 is the portion of the locking slide 400 that traverses through the channel 210. The neck 402 has a same height (or approximately the same height) as the depth of the slot 208.

The retainer segments 404, 406 include a top retainer segment 404 and a bottom retainer segment 406. The top retainer segment 404 is positioned above the neck 402 and the bottom retainer segment 406 is positioned below the neck 402, e.g., along the third direction Z. The top retainer segment 404 engages the first surface 202 of the board 200 (FIG. 1) and functions generally to retain the locking slide 400 within the slot 208 (FIG. 1), e.g., by preventing the locking slide 400 from falling downward through the slot 208 (except when the locking slide 400 is positioned in the assembly opening 220). The bottom retainer segment 406 engages the second surface 204 of the board 200 (FIG. 6) and functions generally to retain the locking slide 400 within the slot 208 (FIG. 1), e.g., by preventing the locking slide 400 from being lifted upward through the slot 208 (except when the locking slide 400 is positioned in the assembly opening 220).

The top retainer segment 404 has a bottom wall 412, a sidewall 414, and a bottom radiused edge 416 that transitions the sidewall 414 to the bottom wall 412. The bottom retainer segment 406 has a top wall 418, a sidewall 420, and a top radiused edge 422 that transitions the sidewall 420 to the top wall 418. The bottom and top radiused edges 416, 422 facilitate the sliding action of the locking slide 400 along the channel 210 (FIG. 2), or more generally, the slot 208 (FIGS. 1 and 2). The bottom retainer segment 406 further has a base wall 424 and a base radiused edge 426 that transitions the sidewall 420 to the base wall 424.

As further shown in FIGS. 3 and 4, the locking slide 400 has a lock segment 408 that engages and secures the second end 308 of the card 300 when the locking slide 400 is positioned in the locking opening 216, e.g., as shown in FIG. 1. The top retainer segment 404 is connected to the lock segment 408. The lock segment 408 has a greater width dimension than the retainer segment to which the lock segment 408 is connected (the top retainer segment 404 in this example). In at least one example, the lock segment 408 has a greater diameter than the top retainer segment 404. This allows the lock segment 408 to be seated on the first surface 302 of the card 300 to latch the card 300 to the board 200, e.g., as shown in FIG. 1. In at least one example, the lock segment 408 has an engagement surface 428 that overhangs the top retainer segment 404. When the locking slide 400 is in position (e.g., in the locking opening 216 as shown in FIG. 1), the engagement surface 428 engages the first surface 302 of the card 300 to latch the card 300 to the board 200.

Further, the locking slide 400 has a grip segment 410 that connects to the lock segment 408. In some embodiments, the grip segment 410 has a width W2 that is less than a diameter of the lock segment 408. The grip segment 410 has a height H sized to enable a user to ergonomically grip the locking slide 400 and slide the locking slide 400 along the slot 208. In some embodiments, the height H of the grip segment 410 is at least twice the width W2. Such an aspect ratio may allow for easy gripping of the locking slide 400. In some alternative embodiments, the grip segment 410 can have a lower profile, e.g., wherein the height H of the grip segment 410 is equal to or less than the width W2 of the grip segment 410. In yet other embodiments, the grip segment 410 can be configured so that the height H of the grip segment 410 is equal to or less than twice the width W2 of the grip segment 410.

Figure 5:
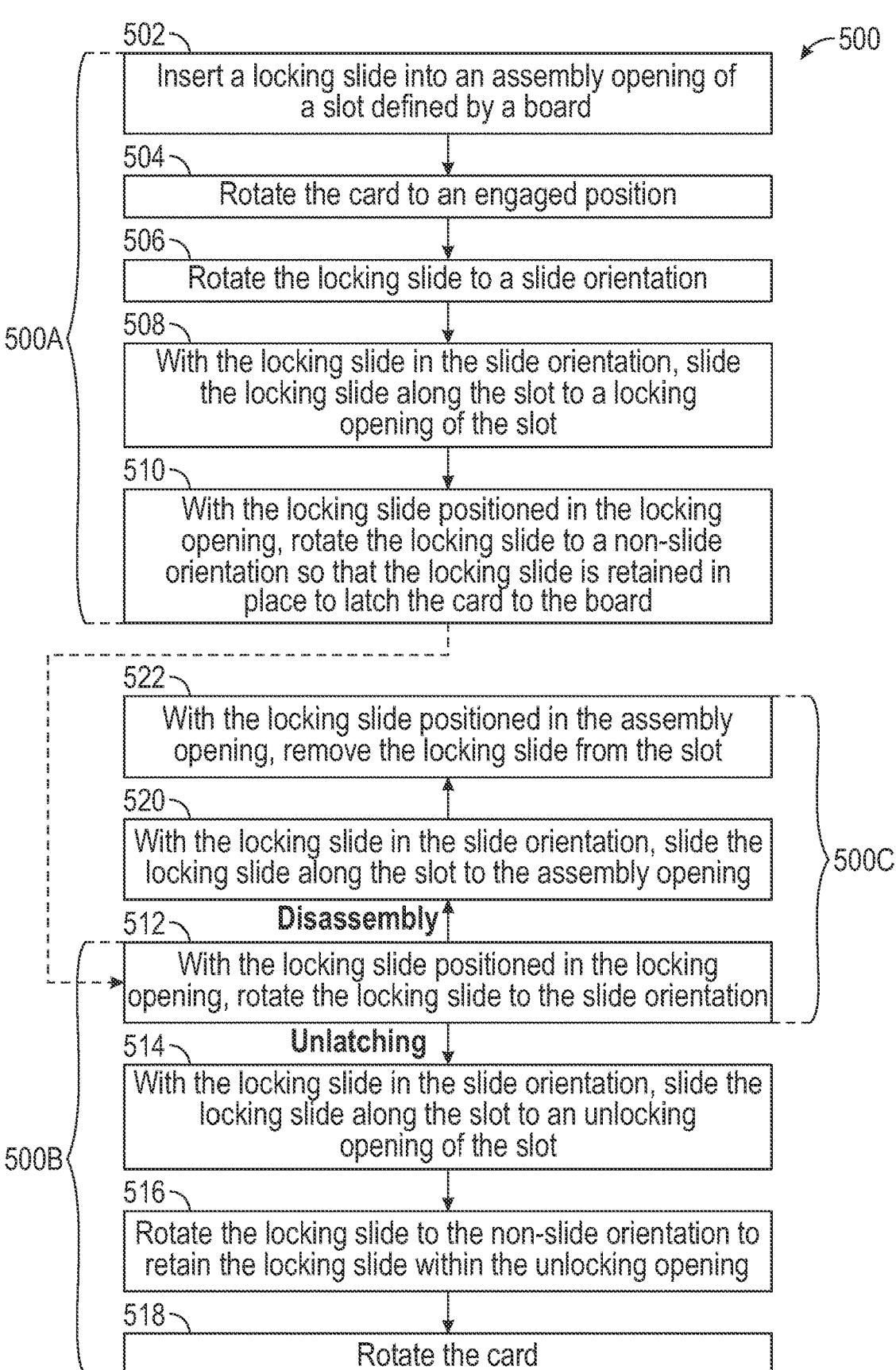
FIG. 5 is a flow diagram for a method.
Figure 6:
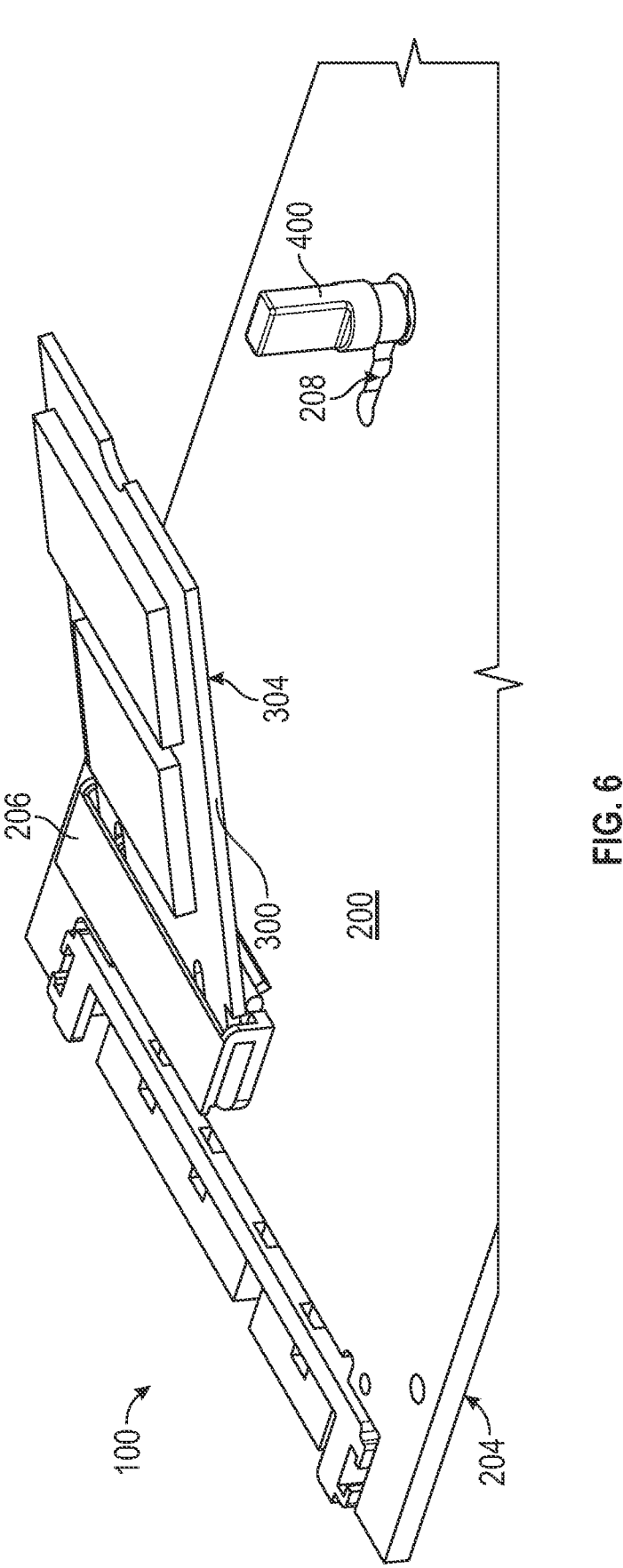
FIGS. 6, 7, and 8 depict the locking slide at various stages of the method of FIG. 5.
Figure 7:
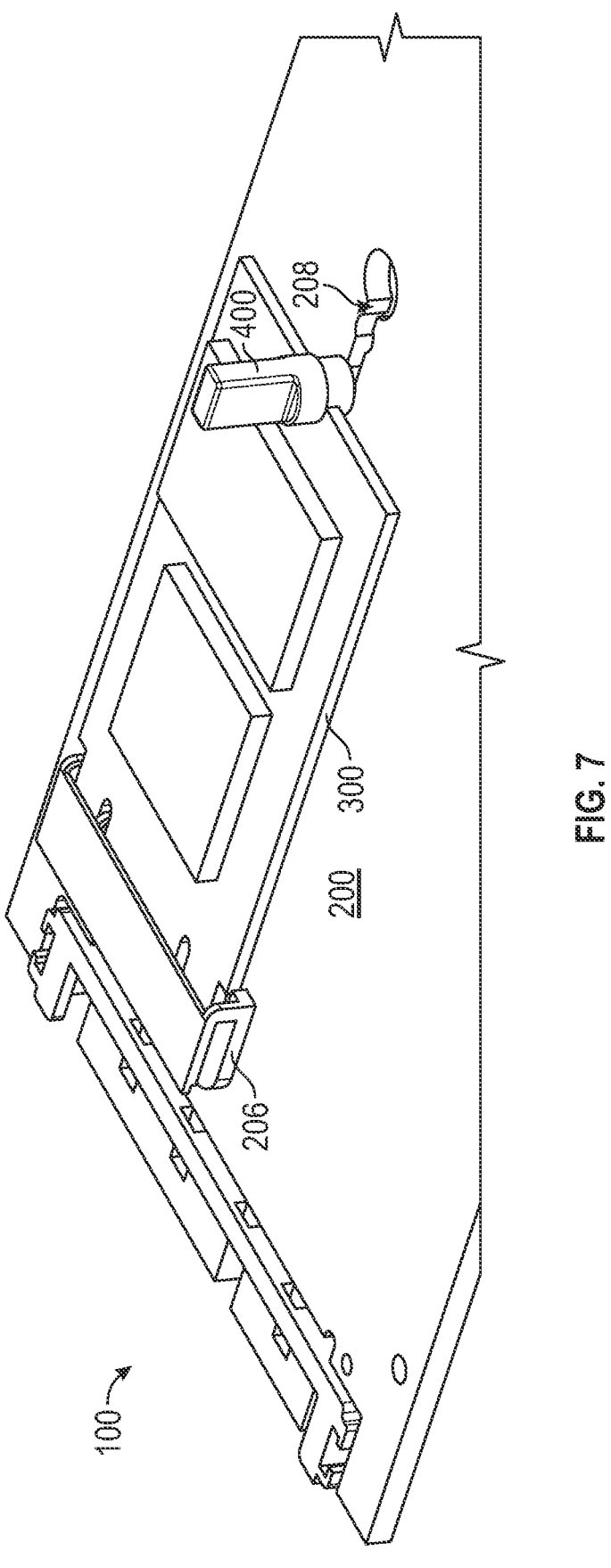
Figure 8:

With reference now to FIGS. 1 through 8, an example manner in which the locking slide 400 of FIGS. 3 and 4, or the rotatable locking slide, can be used to latch/unlatch the card 300 to/from the board 200 will now be described. FIG. 5 is a flow diagram for a method 500. A first portion 500A of the method 500 is directed to latching the card 300 to the board 200 via the locking slide 400, a second portion 500B of the method 500 is directed to unlatching the card 300 from the board 200, and a third portion 500C is directed disassembling the locking slide 400 from the board 200. FIGS. 6, 7, and 8 depict the locking slide 400 at various stages of the method 500 of FIG. 5.

At 502, the method 500 can include inserting the locking slide 400 into the assembly opening 220 of the slot 208 defined by the board 200. For instance, in FIG. 6, the locking slide 400 is shown being inserted into the assembly opening 220 of the slot 208. The diameter of the assembly opening 220 is sized to accommodate the bottom retainer segment 406, or rather, to allow the bottom retainer segment 406 to pass through the slot 208 and consequently be positioned below the second surface 204 of the board 200. This allows the neck 402 to be the portion of the locking slide 400 that is positioned within the slot 208.

At 504, the method 500 can include rotating the card 300 to an engaged position. For instance, with reference to FIG. 6, the first end 306 of the card 300 can be inserted into the connector 206 and rotated downward to the engaged position, which is a position in which the card 300 is to be latched in place relative to the board 200. For this example embodiment, the card 300 extends in a horizontal plane (i.e., a plane perpendicular to the third direction Z) when in the engaged position.

At 506, the method 500 can include rotating the locking slide 400 to a slide orientation. In this way, the locking slide 400 can be slid along the slot 208. In at least one example, when the locking slide 400 is in the slide orientation, the width dimension of the neck 402 is narrower than the width W of the channel 210, which allows the locking slide 400 to be slid along the channel 210 from one enlarged opening to another. Whereas, when the locking slide 400 is in the non-slide orientation, the width dimension of the neck 402 is not narrower than the width W of the channel 210, which prevents the locking slide 400 from being slid along the channel 210 from one enlarged opening to another. By comparing the width dimension of the neck 402 in FIG. 3 (with the locking slide 400 in the slide orientation) to the width dimension of the neck 402 in FIG. 4 (with the locking slide 400 in the non-slide orientation), it will be appreciated that the neck 402 has a narrower width dimension in the slide orientation than in the non-slide orientation. When the locking slide 400 is inserted into the assembly opening 220 already in the slide orientation, the locking slide 400 does not have to be rotated.

At 508, the method 500 can include sliding, with the locking slide 400 in the slide orientation, the locking slide 400 along the slot 208 to the locking opening 216 of the slot 208. For instance, the locking slide 400 can be slid along the second leg 214 of the channel 210, past the unlocking opening 218, along the first leg 212 of the channel 210, and finally into the locking opening 216 as shown in FIG. 7. The locking slide 400 is maintained in the slide orientation throughout the sliding action.

At 510, the method 500 can include rotating, with the locking slide 400 positioned in the locking opening 216, the locking slide 400 to a non-slide orientation so that the locking slide 400 is retained in place to latch the card 300 to the board 200. For instance, once the locking slide 400 is slid into the locking opening 216, the lock segment 408 engages the first surface 302 of the card 300. This applies a downward force on the card 300. By rotating the locking slide 400 from the slide orientation to the non-slide orientation (e.g., from its orientation in FIG. 7 to its orientation in FIG. 8) within the locking opening 216, the locking slide 400 is retained in place along the slot 208, or rather, within the locking opening 216. Consequently, the engagement of the lock segment 408 with the card 300 is maintained, which ultimately securely latches the second end 308 of the card 300 with the board 200. In FIG. 8, the locking slide 400 is shown rotated to the non-slide orientation and latching the card 300 to the board 200.

In some instances, after assembly, it may be desired to unlock or unlatch the card 300 from the board 200, e.g., to repair or replace the card 300. Accordingly, the method 500 can proceed to the second portion 500B for unlocking or unlatching the card 300 from the board 200.

At 512, the method 500 can include rotating, with the locking slide 400 positioned in the locking opening 216, the locking slide 400 to the slide orientation. For instance, while positioned within the locking opening 216, the locking slide 400 can be rotated (e.g., ninety degrees (90°)) about its rotation axis from its orientation in FIG. 8 to its orientation in FIG. 7. Transitioning the locking slide 400 to the slide orientation allows the locking slide 400 to be slid along the slot away from the locking opening 216.

At 514, to unlock or unlatch the card 300 from the board 200, the method 500 can include sliding, with the locking slide 400 in the slide orientation, the locking slide 400 along the slot 208 to the unlocking opening 218. In at least one example, the locking slide 400 can be slid along the first leg 212 of the channel 210 from the locking opening 216 to the unlocking opening 218. Sliding the locking slide 400 away from the locking opening 216 effectively unlatches the card 300 from the board 200.

At 516, the method 500 can include rotating the locking slide 400 to the non-slide orientation to retain the locking slide 400 within the unlocking opening 218. In at least one example, by rotating the locking slide 400 while positioned within the unlocking opening 218, the locking slide 400 is retained within the unlocking opening 218 namely because the width dimension of the neck 402 of the locking slide 400 is wider than the width W of the channel 210. Retaining the locking slide 400 in place within the unlocking opening 218 can allow the card 300 to be rotated and/or removed from the board 200 without removing the locking slide 400 from the board 200.

At 518, the method 500 can include rotating, with the locking slide 400 retained within the unlocking opening 218, the card 300 to a disengaged position. For instance, with the locking slide 400 retained within the unlocking opening 218, the card 300 can be rotated upward to a disengaged position. In this way, the card 300 can be removed from the board 200, for example.

In some instances, instead of sliding the locking slide 400 to the unlocking opening 218 to unlatch the card 300 from the board 200 while retaining the locking slide 400 in the unlocking opening 218, or without removing the locking slide 400 from the board 200, the locking slide 400 can be disassembled or removed from the slot of the board 200, e.g., in accordance with operations 520 and 522.

At 520, after rotating, with the locking slide 400 positioned in the locking opening 216, the locking slide 400 to the slide orientation at 512, the method 500 can include sliding, with the locking slide 400 in the slide orientation, the locking slide 400 along the slot 208 to the assembly opening 220. In at least one example, the locking slide 400 can be slid along the first leg 212 of the channel 210 from the locking opening 216 to the unlocking opening 218 and then along the second leg 214 of the channel 210 from the unlocking opening 218 to the assembly opening 220. Sliding the locking slide 400 away from the locking opening 216 effectively unlatches the card 300 from the board 200.

At 522, the method 500 can include, with the locking slide 400 positioned in the assembly opening 220, removing the locking slide 400 from the slot 208. In at least one example, because the diameter of the assembly opening 220 is greater than the diameter of the bottom retainer segment 406, the locking slide 400 can be lifted out of the assembly opening 220. Or alternatively, because the diameter of the assembly opening 220 is greater than the diameter of the top retainer segment 404, the locking slide 400 can be passed downward through the assembly opening 220.

Although disassembly of the locking slide 400 was described in the context of sliding the locking slide 400 from the locking opening 216 to the assembly opening 220, it will be appreciated that the locking slide 400 can be slid along the slot 208 from the unlocking opening 218 to the assembly opening 220 for disassembly purposes.

In some further embodiments, a locking slide for latching/unlatching a card to/from a board can be configured with an elastically deformable neck. To slide the locking slide from one enlarged opening to another, the elastically deformable neck elastically deforms to a width of a channel interconnecting the enlarged openings. Consequently, the neck applies forces on the opposing sidewalls of the board defining the channel. When the locking slide is positioned within the locking opening of the slot, the neck returns to a neutral state in which the neck is no longer deformed. The locking slide can latch the card to the board and can be retained within the locking opening so long as the force required to elastically deform the neck to fit within the channel is not exceeded. An example locking slide with an elastically deformable neck is provided below.

Figures 9, 10, 11:
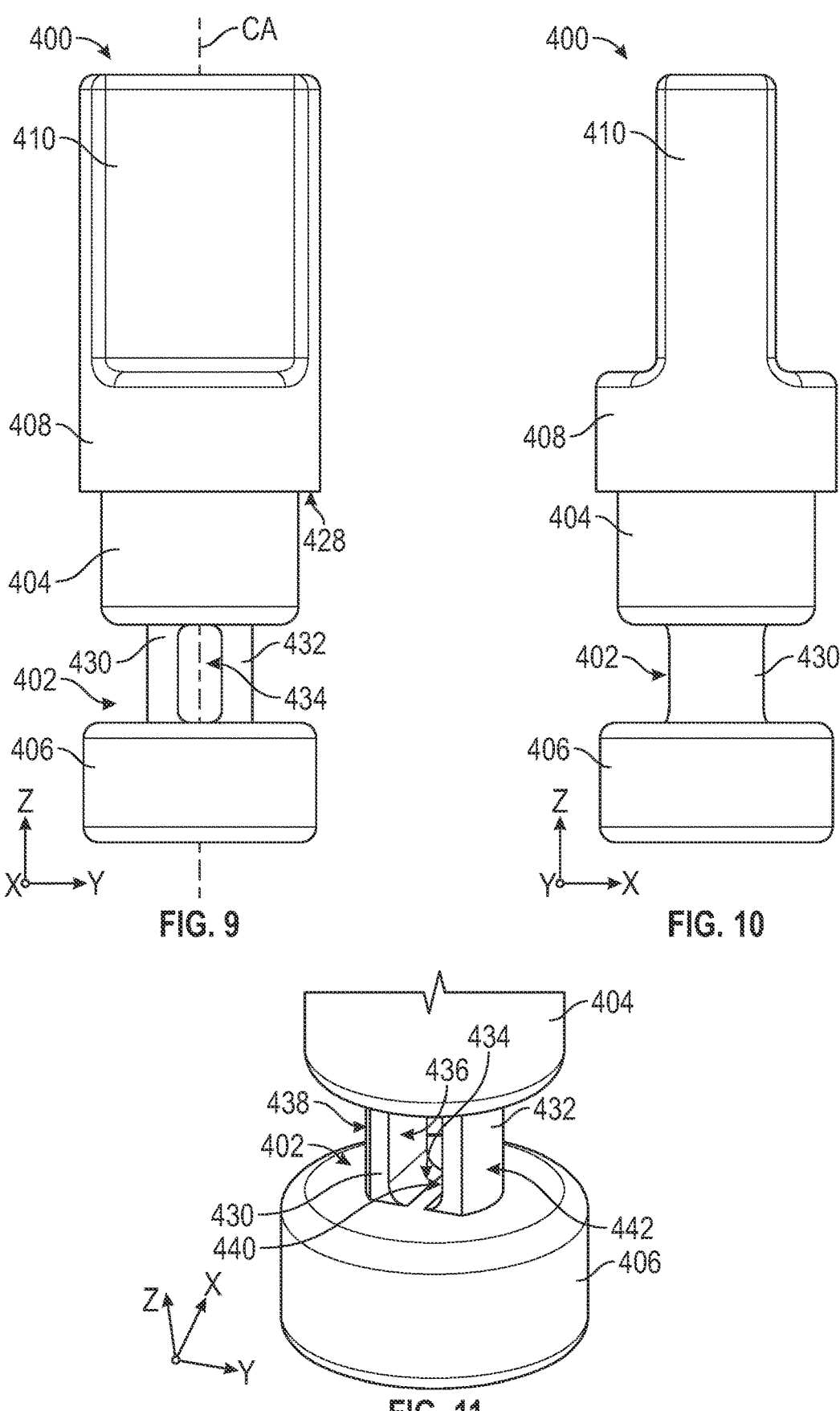
FIGS. 9, 10, and 11 are various views of a locking slide according to another example embodiments of the present disclosure.

FIGS. 9, 10, and 11 respectively provide front, side, and close-up views of the locking slide 400 according to an example embodiment of the present disclosure. The locking slide 400 of FIGS. 9, 10, and 11 is configured in a similar manner as the locking slide 400 of FIGS. 3 and 4 except as provided below.

As shown, the locking slide 400 of FIGS. 9, 10, and 11 is equipped with an elastically deformable neck. That is, the neck 402 of the locking slide 400 is elastically deformable, e.g., when moved along the channel 210 (FIG. 2). The neck

402 has two posts, including a first post 430 and a second post 432. The first and second posts 430, 432 are spaced from one another, e.g., by a void 434. The void 434 has an oval shape, e.g., as viewed along the first direction X. In alternative embodiments, however, the void 434 can have a shape other than an oval as viewed along the first direction X. The first and second posts 430, 432 extend between and respectively connect the retainer segments 404, 406.

The first post 430 has a first inner surface 436 and a first outer surface 438 that is curved. The first outer surface 438 has a concave shape with respect to a central axis CA of the locking slide 400. Similarly, the second post 432 has a second inner surface 440 and a second outer surface 442 that is curved. The second outer surface 442 has a concave shape with respect to the central axis CA of the locking slide 400. The curvature of the first and second outer surfaces 438, 442 can facilitate the sliding of the locking slide 400 along the channel 210 (FIG. 2), e.g., by reducing the overall surface area that the first and second posts 430, 432 engage the sidewalls of the board 200 defining the channel 210 of the slot 208. The first inner surface 436 can include a planar segment and a pair of radiused edges, including a top radiused edge and a bottom radiused edge, that respectively connect the first post 430 with the top retainer segment 404 and the bottom retainer segment 406. Likewise, the second inner surface 440 can include a planar segment and a pair of radiused edges, including a top radiused edge and a bottom radiused edge, that respectively connect the second post 432 with the top retainer segment 404 and the bottom retainer segment 406. Such radiused edges can provide stability to the first and second posts 430, 432, such as when the first and second posts 430, 432 of the neck 402 are elastically deformed as the locking slide 400 is moved through the channel 210 (FIG. 2). In some other embodiments, the first inner surface 436 and the second inner surface 440 can be constructed with a different construction than as described above. For instance, in some embodiments, the first inner surface 436 and the second inner surface 440 can be planar surfaces extending between the top retainer segment 404 and the bottom retainer segment 406.

Figure 13:
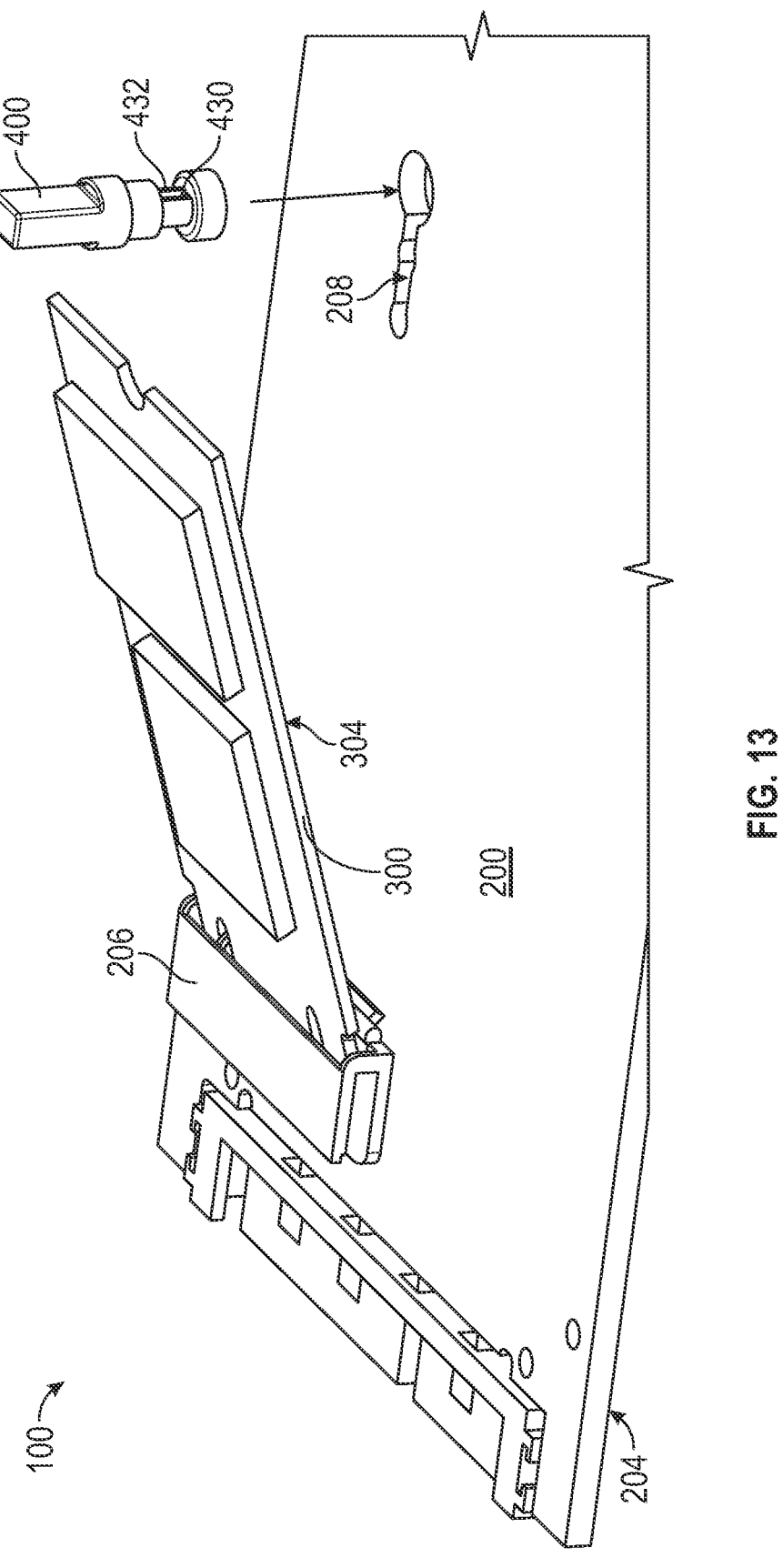
FIGS. 13, 14, and 15 depict the locking slide at various stages of the method of FIG. 12.
Figure 14:
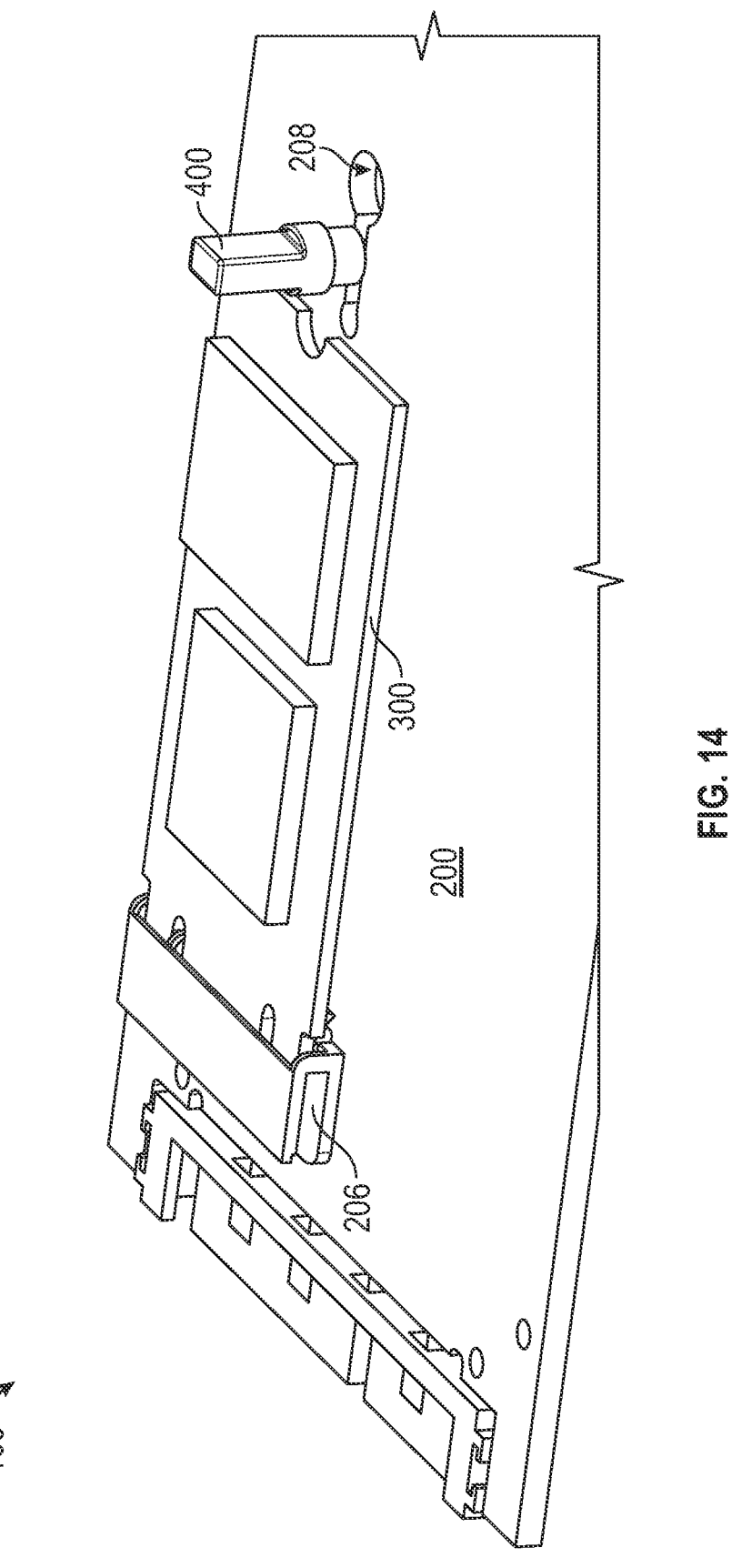
Figure 15:
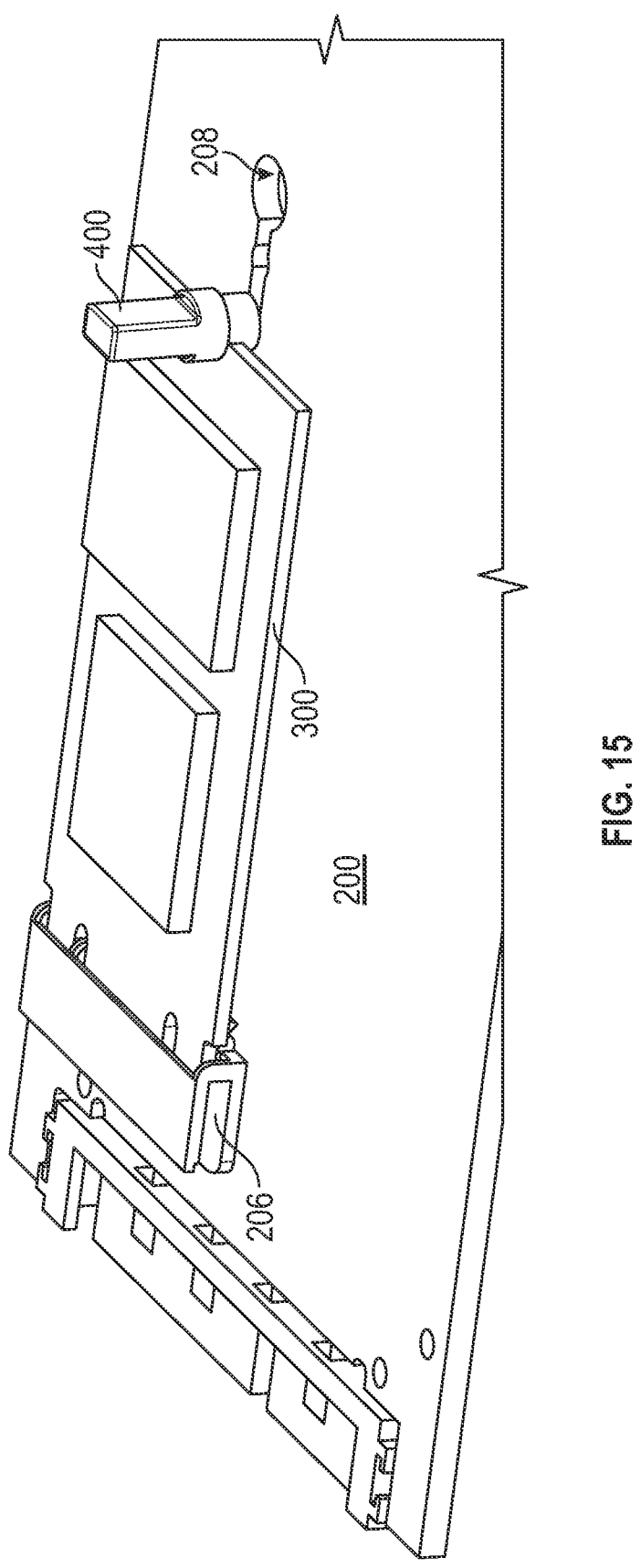

With reference now to FIGS. 1, 2, and 9 through 15, an example manner in which the locking slide 400 of FIGS. 9, 10, and 11, or the locking slide equipped with an elastically deformable neck, can be used to latch/unlatch the card 300 to/from the board 200 will now be described. FIG. 12 is a flow diagram for a method 600. A first portion 600A of the method 600 is directed to latching the card 300 to the board 200 via the locking slide 400, a second portion 600B of the method 600 is directed to unlatching the card 300 from the board 200, and a third portion 600C is directed disassembling the locking slide 400 from the board 200. FIGS. 13, 14, and 15 depict the locking slide 400 at various stages of the method 600 of FIG. 12.

At 602, the method 600 can include inserting the locking slide 400 into the assembly opening 220 of the slot 208 defined by the board 200. For instance, in FIG. 13, the locking slide 400 is shown being inserted into the assembly opening 220 of the slot 208. The diameter of the assembly opening 220 is sized to accommodate the bottom retainer segment 406, or rather, to allow the bottom retainer segment 406 to pass through the slot 208 and consequently be positioned below the second surface 204 of the board 200. This allows the neck 402 to be the portion of the locking slide 400 that is positioned within the slot 208.

At 604, the method 600 can include rotating the card 300 to an engaged position. For instance, with reference to FIG. 13, the card 300 can be rotated downward to the engaged position, which is a position in which the card 300 is to be latched in place relative to the board 200. For this example embodiment, the card 300 extends in a horizontal plane (i.e., a plane perpendicular to the third direction Z) when in the engaged position. The card 300 is shown in the engaged position in FIG. 14.

At 606, the method 600 can include sliding the locking slide 400 along the slot 208 to the locking opening 216 to latch the card 300 with the board 200. For instance, the locking slide 400 can be slid along the second leg 214 of the channel 210, past the unlocking opening 218 (in FIG. 14, the locking slide 400 is shown being slide past the unlocking opening 218), along the first leg 212 of the channel 210, and finally into the locking opening 216 as shown in FIG. 15.

In at least one example, when the locking slide 400 is slid along the second leg 214, the first and second posts 430, 432 of the neck 402 elastically deform in response to engaging the sidewalls of the board 200 that define the second leg 214 of the channel 210. This creates frictional resistance to the sliding action but also prevents the locking slide 400 from inadvertently sliding along the slot 208. When the locking slide 400 reaches the unlocking opening 218, the first and second posts 430, 432 return to their neutral state as they no longer engage the board 200. When the locking slide 400 is slid along the first leg 212 of the channel 210, the first and second posts 430, 432 of the neck 402 elastically deform in response to engaging the sidewalls of the board 200 that define the first leg 212 of the channel 210. This creates frictional resistance to the sliding action but also prevents the locking slide 400 from inadvertently sliding along the slot 208. Finally, when the locking slide 400 reaches the locking opening 216, the first and second posts 430, 432 return to their neutral state once again as they no longer engage the board 200. The engagement surface 428 engages the first surface 302 of the card 300 to latch the card 300 to the board 200. The locking slide 400 is retained in place within the locking opening 216 to latch the card 300 to the board 200 so long as the force required to elastically deform the first and second posts 430, 432 of the neck 402 to fit within the first leg 212 of the channel 210 is not exceeded. In FIG. 15, the locking slide 400 is depicted latching the card 300 to the board 200.

In some instances, after assembly, it may be desired to unlock or unlatch the card 300 from the board 200, e.g., to repair or replace the card 300. Accordingly, the method 600 can proceed to the second portion 600B for unlocking or unlatching the card 300 from the board 200.

At 608, the method 600 can include sliding the locking slide 400 along the slot 208 to the unlocking opening 218. For instance, the grip segment 410 can be gripped and the locking slide 400 can be forced to enter the first leg 212 of the channel 210. The first and second posts 430, 432 of the neck 402 can elastically deform in response to engaging the sidewalls of the board 200 that define the first leg 212 of the channel 210. The locking slide 400 can be slid along the first leg 212 until the locking slide 400 reaches the unlocking opening 218. When the locking slide 400 reaches the unlocking opening 218, the first and second posts 430, 432 of the neck 402 return to their neutral state. The locking slide 400 is retained in place within the unlocking opening 218 so long as the force required to elastically deform the first and second posts 430, 432 of the neck 402 to fit within the first leg 212 or the second leg 214 of the channel 210 is not exceeded. In FIG. 14, the locking slide 400 is depicted positioned within the unlocking opening 218.

At 610, the method 600 can include rotating, with the locking slide 400 retained within the unlocking opening 218, the card 300 to a disengaged position. For instance, with the locking slide 400 retained within the unlocking opening 218, the card 300 can be rotated to the disengaged position. In this way, the card 300 can be removed from the board 200, for example.

In some instances, instead of sliding the locking slide 400 to the unlocking opening 218 to unlatch the card 300 from the board 200 while retaining the locking slide 400 in the unlocking opening 218, the locking slide 400 can be disassembled or removed from the slot of the board 200, e.g., in accordance with operations 612 and 614.

At 612, the method 600 can include sliding the locking slide 400 along the slot 208 to the assembly opening 220. In at least one example, the locking slide 400 can be slid along the first leg 212 of the channel 210 from the locking opening 216 to the unlocking opening 218 and then along the second leg 214 of the channel 210 from the unlocking opening 218 to the assembly opening 220. Sliding the locking slide 400 away from the locking opening 216 effectively unlatches the card 300 from the board 200. The first and second posts 430, 432 elastically deform when the locking slide 400 is slid along the first and second legs 212, 214 but return to their neutral state each time the locking slide is positioned within one of the enlarged openings of the slot 208.

At 614, the method 500 can include, with the locking slide 400 positioned in the assembly opening 220, removing the locking slide 400 from the slot 208. In at least one example, because the diameter of the assembly opening 220 is greater than the diameter of the bottom retainer segment 406, the locking slide 400 can be lifted out of the assembly opening 220. Or alternatively, because the diameter of the assembly opening 220 is greater than the diameter of the top retainer segment 404, the locking slide 400 can be passed downward through the assembly opening 220.

Although disassembly of the locking slide 400 was described in the context of sliding the locking slide 400 from the locking opening 216 to the assembly opening 220, it will be appreciated that the locking slide 400 can be slid along the slot 208 from the unlocking opening 218 to the assembly opening 220 for disassembly purposes.

In some embodiments, a slot defined by a board includes the locking opening and one other enlarged opening, such as the assembly opening.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not an advantage is achieved by a given embodiment is not limiting of the scope of the present disclosure. Thus, the following aspects, features, embodiments and advantages are merely illustrative and are not considered elements or limitations of the appended claims except where explicitly recited in a claim(s).

While the foregoing is directed to embodiments of the present disclosure, other and further embodiments may be devised without departing from the basic scope thereof, and the scope thereof is determined by the claims that follow.

What is claimed is:

1. An apparatus, comprising:

a board defining a slot, the slot has a channel that interconnects at least two enlarged openings, the at least two enlarged openings including a locking opening;

a card; and a locking slide having a neck and retainer segments on opposing sides of the neck that retain the locking slide in the slot, wherein the locking slide is rotatable within each one of the at least two enlarged openings but is not rotatable within the channel interconnecting the at least two enlarged openings, and wherein the locking slide is slidable along the channel from one enlarged opening to another, the locking slide has a lock segment that latches the card to the board when the locking slide is positioned in the locking opening.

2. The apparatus of claim 1, wherein the at least two enlarged openings include the locking opening, an unlocking opening, and an assembly opening.

3. The apparatus of claim 2, wherein the locking opening, the unlocking opening, and the assembly opening are spaced from one another and are serially interconnected by the channel.

4. The apparatus of claim 2, wherein the assembly opening has a greater diameter than both the locking opening and the unlocking opening.

5. The apparatus of claim 4, wherein the locking opening and the unlocking opening have a same diameter.

6. The apparatus of claim 1, wherein the channel has a fixed width that is narrower than each one of the at least two enlarged openings.

7. The apparatus of claim 1, wherein the card defines a latch cutout that receives one of the retainer segments when the locking slide is positioned in the locking opening.

8. The apparatus of claim 1, wherein the card has a top surface and a bottom surface, and wherein the lock segment engages the top surface of the card when the locking slide is positioned in the locking opening.

9. The apparatus of claim 1, wherein the retainer segments include a top retainer segment and a bottom retainer segment, the top retainer segment is positioned above the neck and the bottom retainer segment is positioned below the neck, and wherein the top retainer segment is connected to the lock segment, the lock segment has a greater diameter than the top retainer segment.

10. The apparatus of claim 1, wherein the retainer segments include a top retainer segment, the top retainer segment is positioned above the neck, and wherein the top retainer segment has a bottom wall, a sidewall, and a bottom radiused edge that transitions the sidewall to the bottom wall.

11. The apparatus of claim 1, wherein the retainer segments include a bottom retainer segment, the bottom retainer segment is positioned below the neck, and wherein the bottom retainer segment has a top wall, a sidewall, and a top radiused edge that transitions the sidewall to the top wall.

12. The apparatus of claim 1, wherein the retainer segments include a bottom retainer segment, the bottom retainer segment is positioned below the neck, and wherein the bottom retainer segment has a base wall, a sidewall, and a base radiused edge that transitions the sidewall to the base wall.

13. The apparatus of claim 1, wherein the locking slide has a grip segment that connects to the lock segment.

14. The apparatus of claim 1, wherein the neck has two posts spaced from one another, the two posts extend between and connect the retainer segments.

15. A method, comprising:

sliding a locking slide along a channel of a slot defined by a board, the locking slide being slid along the channel toward a locking opening of the slot, the locking slide has a neck and retainer segments on opposing sides of the neck that retain the neck in the slot as the locking slide is slid along the channel, the locking opening has a diameter that is wider than a width of the channel; and latching, with the locking slide positioned in the locking opening, a lock segment of the locking slide with a card to secure the card to the board.

16. The method of claim 15, wherein the locking slide is slid along the channel while oriented in a slide orientation, and wherein the method further comprises:

rotating, with the locking slide positioned in the locking opening, the locking slide into a non-slide orientation to prevent the locking slide from sliding along the channel.

17. The method of claim 15, wherein when the locking slide is slid along the channel, a first and second post of the neck elastically deform.

18. The method of claim 15, further comprising:

sliding the locking slide along the channel to an enlarged opening of the slot, the enlarged opening has a diameter that is wider than the width of the channel.

19. A locking slide, comprising:

a neck;

retainer segments on opposing sides of the neck, the neck has a narrower width dimension than both the retainer segments; and a lock segment connected to one of the retainer segments, the lock segment has a greater width dimension than the retainer segment to which the lock segment is connected, the lock segment is configured to engage and secure a card to a board when the locking slide is positioned in a locking opening of a slot defined by the board.

* * * * *